United States Patent [19]
Kawamoto

[11] 3,967,364
[45] July 6, 1976

[54] METHOD OF MANUFACTURING SEMICONDUCTOR DEVICES

[75] Inventor: Hiroshi Kawamoto, Kodaira, Japan

[73] Assignee: Hitachi, Ltd., Japan

[22] Filed: Sept. 6, 1974

[21] Appl. No.: 503,875

[30] Foreign Application Priority Data
Oct. 12, 1973 Japan............................ 48-113931

[52] U.S. Cl.................................... 29/578; 29/571
[51] Int. Cl.².................. H01L 21/88; H01L 21/441
[58] Field of Search...................... 29/578, 571, 589

[56] References Cited
UNITED STATES PATENTS

| | | | |
|---|---|---|---|
| 3,623,217 | 11/1971 | Kawagoe et al. | 29/571 |
| 3,673,679 | 7/1972 | Carbajal et al. | 29/571 |
| 3,700,507 | 10/1972 | Murray | 29/571 X |
| 3,785,043 | 1/1974 | Tokuyama et al. | 29/578 |
| 3,789,503 | 2/1974 | Nishida et al. | 29/578 X |
| 3,803,705 | 4/1974 | Goodwin | 29/578 X |
| 3,818,582 | 6/1974 | Kaiser | 29/578 X |
| 3,824,677 | 7/1974 | Scherber | 29/578 X |

*Primary Examiner*—Victor A. Dipalma
*Attorney, Agent, or Firm*—Craig & Antonelli

[57] ABSTRACT

A method of manufacturing a MOSIC comprises the steps of forming a diffused layer selectively in one principal plane of a semiconductor substrate, forming a first insulating film on the substrate, forming a first wiring layer after providing holes in the first insulating film, diffusing an impurity through the holes to form source and drain regions, forming a second insulating film on the first wiring layer, and thereafter forming a second wiring layer which is connected with the diffused layer.

16 Claims, 7 Drawing Figures

METHOD OF MANUFACTURING SEMICONDUCTOR DEVICES

BACKGROUND OF THE INVENTION

1. Field of the Invention

This invention relates to a method of manufacturing semiconductor devices and, more particularly, silicon gate MOS LSIs.

In the field of a silicon gate MOS LSI, there is a method which employs a diffused layer as a wiring layer.

2. Description of the Prior Art

In the formation of a diffused layer for a wiring layer, there has heretofore been put into practice a method in which, during the diffusion of an impurity for forming a source and a drain, the impurity is simultaneously diffused into a field portion. With reference to FIG. 2, after forming a wiring layer 11 of polysilicon on the field portion, an insulating film 15 is formed on a thermal oxidation film 2 on the surface of a substrate 1 by a CVD (chemical vapor deposition) process. Further, contact holes 15a are provided in the insulating film 15, and thus a connection between an aluminum wiring 16 and a diffused layer 3 for wiring within the substrate 1 is carried out.

With the above method, however, the perforation portion 2a of the thermal oxidation film 2 on the surface of the semiconductor substrate 1 is large, so that in forming the polysilicon wiring layer 11 on the thermal oxidation film 2, the area over which the polysilicon wiring layer 11 can be formed becomes small, it being difficult to enhance the degree of integration of the semiconductor device.

More specifically, the contact hole 15a requires a width or a diameter dimension of, for example, over $6\mu$. In order to prevent a short-circuit at the PN junction caused by the aluminum of the aluminum wiring 16 diffusing into the silicon substrate 1, a distance of, for example, over $4\mu$ is needed between the peripheral edge of the contact hole 15a and the PN junction. For these reasons, the perforation portion 2a (the hole for diffusion for forming the diffused layer 3) in the thermal oxidation film 2 is inevitably so large that the width or the diameter dimension is, for example, over $14\mu$.

BRIEF SUMMARY OF THE INVENTION

It is an object of the present invention to provide a method of manufacturing a semiconductor device which, in the production of a semiconductor device having a diffused layer as a wiring or interconnection layer within a semiconductr substrate, can reduce the size of the perforation area in a contact portion of the wiring diffused layer and can, accordingly, increase the degree of integration of the semiconductor device.

The present invention will be explained in detail hereunder in connection with an embodiment thereof with reference to the drawings.

DETAILED DESCRIPTION OF THE INVENTION

Figure 1A:
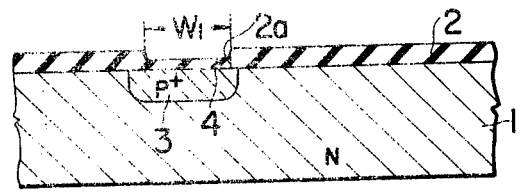
FIGS. 1a to 1f are sectional views of the essential portions of a semiconductor device for the various steps for manufacturing a silicon gate MOS IC according to the present invention, respectively.

As shown in FIG. 1a, a silicon oxide film 2 is formed on a silicon substrate 1 of N-type, for example, by thermally oxidizing the surface of the silicon substrate 1. Then, part of the oxide film is removed by conventional photo-etching techniques, to form a hole 2a having a width $W_1$ of $14\mu$.

A P-type impurity of boron, for example, is diffused through the hole 2a by conventional diffusion techniques, to thereby form a P-type diffused layer 3 to be employed for wiring. The wiring layer 3 has a diffusion depth of 2–3 $\mu$ and a resistance value of 50–100 $\Omega/cm^2$. During the diffusion, the P-type layer is covered with a thermally grown silicon oxide film 4.

Figure 1B:
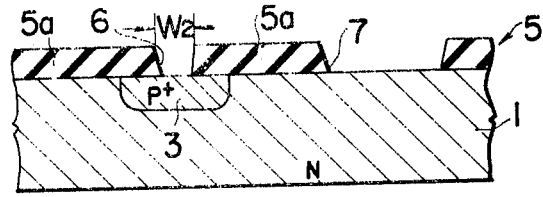

Subsequently, as shown in FIG. 1b, the surface of the substrate 1 is further subjected to a thermal oxidation treatment, to form a thick oxide film 5 of approximately 14,000 A thickness on the surface of the substrate. By this oxidation treatment, the oxide films 2 and 4 are thickened to form a resulting oxide film 5. Thereafter, the perforation of holes 6 and 7 is carried out in the oxide film 5 by conventional photo-etching techniques. At this time, the width $W_2$ of the hole 6 is approximately $6\mu$ and is considerably small in comparison with that of the hole 2a (FIG. 1a). Consequently, the area of a field portion 5a of the oxide film 5 is greater than in the prior art by a value obtained by subtracting the area of the hole 6 from the area of the hole 2a i.e. by approximately $8\mu$.

Figure 1C:
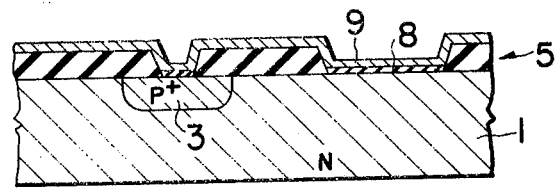

As is shown in FIG. 1c, the exposed surface of the substrate 1 is oxidized to form a silicon oxide film 8 of 1,000–1,300 A thickness, and polycrystalline silicon is deposited on the oxide films by conventional CVD techniques (the thermal decomposition of $SiH_4$), to form a polycrystalline silicon film 9 of 4,000 A thickness.

Figure 1D:
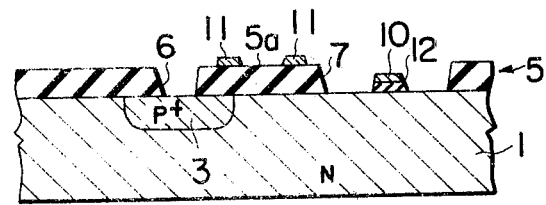

Then, as shown in FIG. 1d, the polycrystalline silicon layer 9 is shaped by conventional etching techniques, to leave a silicon gate 10 and polycrystalline silicon layers 11 for wiring or interconnections on the field oxide film 5a. The thin oxide film 8 is selectively etched away using the silicon gate 10 as an etchant-resistive mask, to form a gate oxide 12 beneath the gate 10.

Figure 1E:
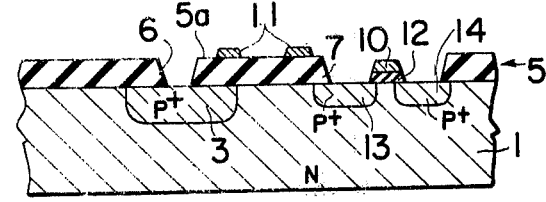

Thereafter, as shown in FIG. 1e, a P-type impurity boron, for example, is again diffused into the substrate 1, through the holes 6 and 7, to form a source 13 and drain 14. The source 13 and the drain 14 have a diffusion depth of approximately $1\mu$ and a resistance value of 15–20 $\Omega/cm^2$, respectively.

Figure 1F:
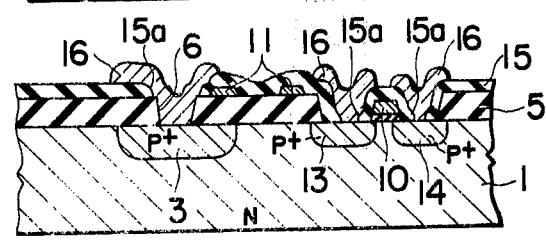
Figure 2:
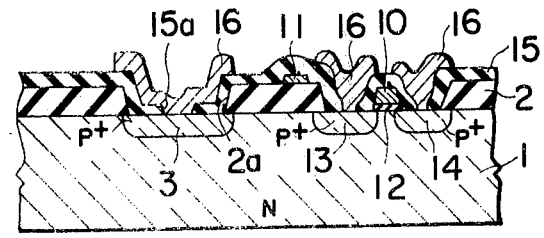
FIG. 2 is a sectional view of the esential portions of a prior-art MOS IC.

Thereafter, as shown in FIG. 1f, a PSG film (phospho-silicate-glass film) 15 is formed by the CVD process (the oxidation of thermally decomposed $SiH_4$) on the substrate 1. Further, contact holes 15a are formed by perforating predetermined parts of the PSG film 15 by conventional photo-etching techniques. Then, aluminum wiring and electrode layers 16 are formed in the contact holes 15a. The wiring and electrode layers 16 may be connected to the wiring layer 11. At this time, since the PSG film 15 becomes thick at the edge parts of the oxide film 5, disconnection of the aluminum wiring and electrode layers 16 is prone to occur at the edge parts. Such a disconnection, however, can be prevented by etching the PSG film at the edge parts.

As described above, in conformity with the method of manufacturing a semiconductor device according to the present invention, in the production of a semiconductor device having a diffused layer as a wiring layer within a semiconductor substrate, the diffused layer for wiring is first formed and an insulating film (a thermal oxidation film) is thereafter formed on the surface of the substrate, so that the area of a field portion of the insulating film can be made large and that the degree of freedom of the wiring of a polysilicon wiring layer to be formed on the field portion accordingly becomes large, whereby the degree of integration of the semiconductor device can be enhanced. Moreover, since the impurity concentration of the diffused layer for wiring can be made high, the resistance value of the wiring layer can be lowered.

Also, since the diffused layer can be formed at a large diffusion depth, the operating voltage can be increased.

While I have shown and described one embodiment in accordance with the present invention, it is understood that the same is not limited thereto but is susceptible of numerous changes and modifications as known to a person skilled in the art and I, therefore do not wish to be limited to the details shown and described herein but intend to cover all such changes and modifications as are obvious to one of ordinary skill in the art.

I claim:

1. A method of manufacturing a semiconductor device comprising the steps of:
   a. selectively introducing a first impurity of a first conductivity type into a first surface portion of a semiconductor substrate of a second conductivity type, opposite said first conductivity type, to form a first semiconductor region of said first conductivity type in the surface of said substrate;
   b. forming a first layer of insulating material on the surface of said substrate;
   c. forming a first hole in said first layer of insulating material to expose a second surface portion of said substrate spaced apart from said first surface portion;
   d. introducing a second impurity into said substrate through said first hole to form a second semiconductor region which constitutes a semiconductor circuit element;
   e. forming a wiring layer on a part of said layer of insulating material covering said first surface of said first semiconductor region;
   f. forming a second hole in said first layer of insulating material to expose a surface portion of said first semiconductor region;
   g. forming a second layer of insulating material to cover at least said wiring layer and a portion of said second semiconductor region; and
   h. connecting, through said first and second holes, electrodes to said first and second semiconductor regions.

2. A method according to claim 1, wherein the depth of said first semiconductor region is greater than the depth of said second semiconductor region.

3. A method of manufacturing a semiconductor device comprising the steps of:
   a. selectively introducing a first impurity of a first conductivity type into a first surface portion of a semiconductor substrate of a second conductivity type, opposite said first conductivity type, to form a first semiconductor region of said first conductivity type in the surface of said substrate;
   b. forming a first layer of insulating material on the surface of said substrate;
   c. forming a first hole in said first layer of insulating material to expose a second surface portion of said substrate spaced apart from said first surface portion;
   d. forming, in said first hole, a second layer of insulating material thinner than said first layer of insulating material;
   e. depositing a silicon layer on said first and second layers of insulating material;
   f. selectively removing portions of said silicon layer to thereby form a wiring layer on a part of said first layer of insulating material covering said first surface of said first semiconductor region and a silicon gate electrode on said second layer of insulating material;
   g. selectively removing portions of said second layer of insulating material not covered with said silicon gate electrode to expose parts of said second surface portion of said substrate;
   h. introducing a second impurity of said first conductivity type into said exposed parts of said second surface portion of said substrate to form second and third semiconductor regions constituting respective source and drain regions of a semiconductor circuit element;
   i. forming a second hole in said first layer of insulating material to expose a surface portion of said first semiconductor region;
   j. forming a third layer of insulating material to cover at least said wiring layer and portions of said second and third semiconductor regions; and
   k. connecting, through said first and second holes, respective electrodes to said first, second and third semiconductor regions.

4. A method according to claim 3, wherein the depth of said first semiconductor region is greater than the depth of said second and third semiconductor regions.

5. A method according to claim 3 wherein steps (c) and (i) are carried out simultaneously.

6. A method according to claim 3 wherein step (f) includes selectively removing portions of said silicon layer overlying the first surface of said substrate between said second surface portion and said second hole to be formed in step (i), to thereby form said wiring layer between said second surface portion and said second hole to be formed in step (i).

7. A method according to claim 4, wherein steps (c) and (i) are carried out simultaneously.

8. A method according to claim 7 wherein step (f) includes selectively removing portions of said silicon layer overlying the first surface of said substrate between said second surface portion and said second hole to be formed in step (i), to thereby form said wiring layer between said second surface portion and said second hole to be formed in step (i).

9. A method according to claim 3, wherein the depth of said first semiconductor region is within a range of from 2 to 3 $\mu$, while the depth of said second and third semiconductor regions is approximately 1$\mu$.

10. A method according to claim 3, wherein the width of the portion of said first layer of insulating material is between said first and second surface portions of said substrate.

11. A method according to claim 6 wherein step (f) further includes selectively removing portions of said silicon layer overlying the surface of said substrate between the first and second surface portions thereof, to thereby form another wiring layer between said first and second surface portion of said substrate.

12. A method of manufacturing a semiconductor device comprising the step of:
  a. forming a first hole in a first layer insulating material to expose a first surface portion of a semiconductor substrate of a second conductivity type;
  b. introducing a first impurity of a first conductivity type, opposite said second conductivity type, through the first hole, to form a first semiconductor region of said first conductivity type in the surface of said substrate;
  c. forming a second insulating layer covering said first semiconductor region;
  d. forming a second hole in said first layer of insulating material to expose a second surface portion of said substrate spaced apart from said first surface portion;
  e. forming, in said second hole, a third layer of insulating material thinner than each of said first and second layers of insulating material;
  f. depositing a silicon layer on said first, second and third layers of insulating material;
  g. selectively removing portions of said silicon layer to thereby form a wiring layer on said second layer of insulating material and a silicon gate electrode on said third layer of insulating material;
  h. selectively removing portions of said third layer of insulating material not covered with said silicon gate electrode to expose parts of said second surface portion of said substrate;
  i. introducing a second impurity of said first conductivity type into said exposed parts of said second surface portion of said substrate to form second and third semiconductor regions constituting respective source and drain regions of a semiconductor circuit element;
  j. forming a third hold in said second layer of insulating material to expose a surface portion of said first semiconductor region, the third hole being smaller than the first hole;
  k. forming a fourth layer of insulating material to cover at least said wiring layer and portions of said second and third semiconductor regions, and
  l. connecting, through said third and second holes; respective electrodes to said first, second and third semiconductor regions.

13. A method according to claim 12, wherein step (b) and (c) are carried out simultaneously.

14. A method according to claim 12, wherein one of said electrodes is extended over at least a portion of said wiring layer.

15. A method according to claim 12, wherein step (g) includes selectively removing portions of said silicon layer overlying the first surface of said substrate between said second surface portion and said third hole to be formed in step (j) to thereby form said wiring layer between said second surface portion and said third hole to be formed in step (j).

16. A method according to claim 15, wherein step (g) further includes selectively removing portions of said silicon layer overlying the surface of said substrate between the first and second surface portions thereof, the thereby form another wiring layer between said first and second surface portion of said substrate.

* * * * *